United States Patent
Kim et al.

(10) Patent No.: US 11,380,402 B2
(45) Date of Patent: Jul. 5, 2022

(54) MEMORY SYSTEM AND OPERATING METHOD THEREOF

(71) Applicant: SK hynix Inc., Gyeonggi-do (KR)

(72) Inventors: Sang Sik Kim, Gyeonggi-do (KR); Dae Sung Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 12 days.

(21) Appl. No.: 17/011,555

(22) Filed: Sep. 3, 2020

(65) Prior Publication Data

US 2021/0241834 A1 Aug. 5, 2021

(30) Foreign Application Priority Data

Feb. 5, 2020 (KR) .................. 10-2020-0013816

(51) Int. Cl.
*G11C 16/16* (2006.01)
*G11C 16/26* (2006.01)
*G11C 11/56* (2006.01)

(52) U.S. Cl.
CPC .......... *G11C 16/16* (2013.01); *G11C 11/5628* (2013.01); *G11C 11/5642* (2013.01); *G11C 16/26* (2013.01)

(58) Field of Classification Search
CPC . G11C 16/16; G11C 11/5628; G11C 11/5642; G11C 16/26; G11C 16/10; G11C 2211/5648; G11C 16/0483; G11C 16/14; G06F 3/064; G06F 3/0658
USPC .................................................... 365/185.03
See application file for complete search history.

(56) References Cited

U.S. PATENT DOCUMENTS

| | | | | |
|---|---|---|---|---|
| 7,061,812 B2 * | 6/2006 | Shinagawa | ......... | G06F 12/0246 365/185.29 |
| 2017/0235633 A1 * | 8/2017 | Park | .................... | G06F 11/1048 714/764 |
| 2018/0082752 A1 * | 3/2018 | Park | ........................ | G11C 16/10 |
| 2020/0098433 A1 * | 3/2020 | Jeon | .................... | G11C 16/0483 |
| 2020/0133767 A1 * | 4/2020 | Yang | ..................... | H03M 13/09 |

FOREIGN PATENT DOCUMENTS

KR 10-2018-0087322 8/2018
KR 10-2019-0085379 7/2019

* cited by examiner

*Primary Examiner* — Hoai V Ho
*Assistant Examiner* — Minh Dinh
(74) *Attorney, Agent, or Firm* — IP & T Group LLP

(57) ABSTRACT

A memory system includes a memory device including a plane including a plurality of memory blocks for storing multi-bit data; and a controller configured to detect, when a problem-causing operation is performed on a first memory block among the memory blocks, remaining memory blocks, except the first memory block, in the plane as being in a problem occurrence candidate group, search for a table, when a read command for a second memory block of the problem occurrence candidate group is received, for a read voltage application order corresponding to the second memory block, and control the memory device to perform a read operation on the second memory block by sequentially applying a plurality of read voltages according to the searched read voltage application order, wherein the problem-causing operation is a program operation or an erase operation.

20 Claims, 14 Drawing Sheets

FIG. 11

| PLANEi | BLKi | FLAG BIT |
|---|---|---|
| PLANE0 | BLK1 | 0 |
| | BLK2 | 1 |
| | ⋮ | ⋮ |
| | BLK10 | 1 |
| | BLK11 | 1 |
| | BLK12 | 1 |

FIG. 12

| | | |
|---|---|---|
| LSB READ | CASE1-1 | R3→R7 |
| | CASE1-2 | R7→R3 |
| CSB READ | CASE2-1 | R2→R4→R6 |
| | CASE2-2 | R2→R6→R4 |
| | CASE2-3 | R4→R2→R6 |
| | CASE2-4 | R4→R6→R2 |
| | CASE2-5 | R6→R2→R4 |
| | CASE2-6 | R6→R4→R2 |
| MSB READ | CASE3-1 | R1→R5 |
| | CASE3-2 | R5→R1 |

FIG. 13

| INFO_PLANE | INFO_BLK | LSB READ | CSB READ | MSB READ |
|---|---|---|---|---|
| PLANE0 | BLK1 | R7→R3 | R2→R6→R4 | R1→R5 |
| | BLK2 | R3→R7 | R4→R6→R2 | R5→R1 |
| | ⋮ | ⋮ | ⋮ | ⋮ |
| | BLK10 | R3→R7 | R6→R4→R2 | R1→R5 |
| | BLK11 | R3→R7 | R2→R4→R6 | R5→R1 |
| | BLK12 | R7→R3 | R4→R2→R6 | R1→R5 |

| PLANEi | BLKi | FLAG BIT |
|---|---|---|
| PLANE0 | BLK1 | 0 |
| | BLK2 | 0 |
| | ⋮ | ⋮ |
| | BLK10 | 1 |
| | BLK11 | 1 |
| | BLK12 | 1 |

MEMORY SYSTEM AND OPERATING METHOD THEREOF

CROSS-REFERENCE TO RELATED APPLICATION

This application claims priority under 35 U.S.C. § 119 to Korean Patent Application No. 10-2020-0013816, filed on Feb. 5, 2020, which is incorporated herein by reference in its entirety.

BACKGROUND

1. Field

Various embodiments relate to a memory system, and more particularly, to a memory system and an operating method thereof for improving the efficiency of a read operation.

2. Discussion of the Related Art

Recently, the paradigm for the computer environment has shifted to ubiquitous computing in which computer systems can be used anytime and anywhere. Due to this, the use of portable electronic devices such as mobile phones, digital cameras, and notebook computers has rapidly increased. In general, such portable electronic devices use a memory system which uses a memory device, that is, a data storage device. The data storage device is used as a main memory device or an auxiliary memory device of the portable electronic devices.

A data storage device using a memory device has no mechanical driving part, and thus has excellent stability and durability, high information access speed and low power consumption.

Examples of data storage devices having such advantages include a universal serial bus (USB) memory device, memory cards having various interfaces, and a solid state drive (SSD).

SUMMARY

Various embodiments of the disclosure are directed to a memory system capable of increasing the possibility of success of a read operation by determining an order of applying read voltages, based on a preset table, and performing the read operation according to the determined order.

In an embodiment, a memory system may include: a memory device including a plane including a plurality of memory blocks for storing multi-bit data; and a controller configured to detect, when a problem-causing operation is performed on a first memory block among the memory blocks, remaining memory blocks except the first memory block, in the plane as being in a problem occurrence candidate group, search a table, when a read command for a second memory block of the problem occurrence candidate group is received, a read voltage application order corresponding to the second memory block, and control the memory device to perform a read operation on the second memory block by sequentially applying a plurality of read voltages according to the searched read voltage application order, wherein the problem-causing operation is a program operation or an erase operation.

In an embodiment, a method for operating a memory system may include: performing a problem-causing operation on a first memory block among memory blocks included in a plane, in which multi-bit data is stored in each cell; detecting remaining memory blocks, except the first memory block, in the plane, as being in a problem occurrence candidate group; receiving a read command for a second memory block of the problem occurrence candidate group; searching for a read voltage application order corresponding to the second memory block from a table; and performing a read operation on the second memory block by sequentially applying a plurality of read voltages according to the searched read voltage application order, wherein the problem-causing operation is a program operation or an erase operation.

In an embodiment, an operating method of a controller, the operating method comprising: controlling a memory device to perform a program operation or an erase operation on a first block; controlling, in response to a command immediately after the program or erase operation, the memory device to perform a first default read operation on a second block based on a secondary set of read voltages, the second block neighboring the first block; and controlling, in response to a command immediately after a successful read operation set including the first default read operation on the second block, the memory device to perform a second default read operation on the second block based on a primary set of read voltages, wherein the primary and secondary sets have different application orders of the read voltages.

In the case where a program operation or an erase operation is performed on a first memory block, a threshold voltage distribution for a second memory block included in the same plane as the first memory block may be temporarily changed. According to the embodiments of the disclosure, the memory system may determine an order of applying read voltages, based on a preset table, and may perform the read operation according to the determined order. Therefore, it is possible to prevent a phenomenon in which a read operation fails due to the temporary change in the threshold voltage distribution and thus read retry step is entered.

BRIEF DESCRIPTION OF THE DRAWINGS

FIG. 11 is a diagram to assist in the explanation of a method for indicating whether a memory block is detected as being in a problem occurrence candidate group, by using a flag bit for the memory block.

FIGS. 12 and 13 are diagrams to assist in the explanation of a table including read voltage application orders.

FIG. 14 is a diagram illustrating flag bits for memory blocks, respectively, a memory block, as the problem occurrence candidate group, is released.

DETAILED DESCRIPTION

Figure 1:
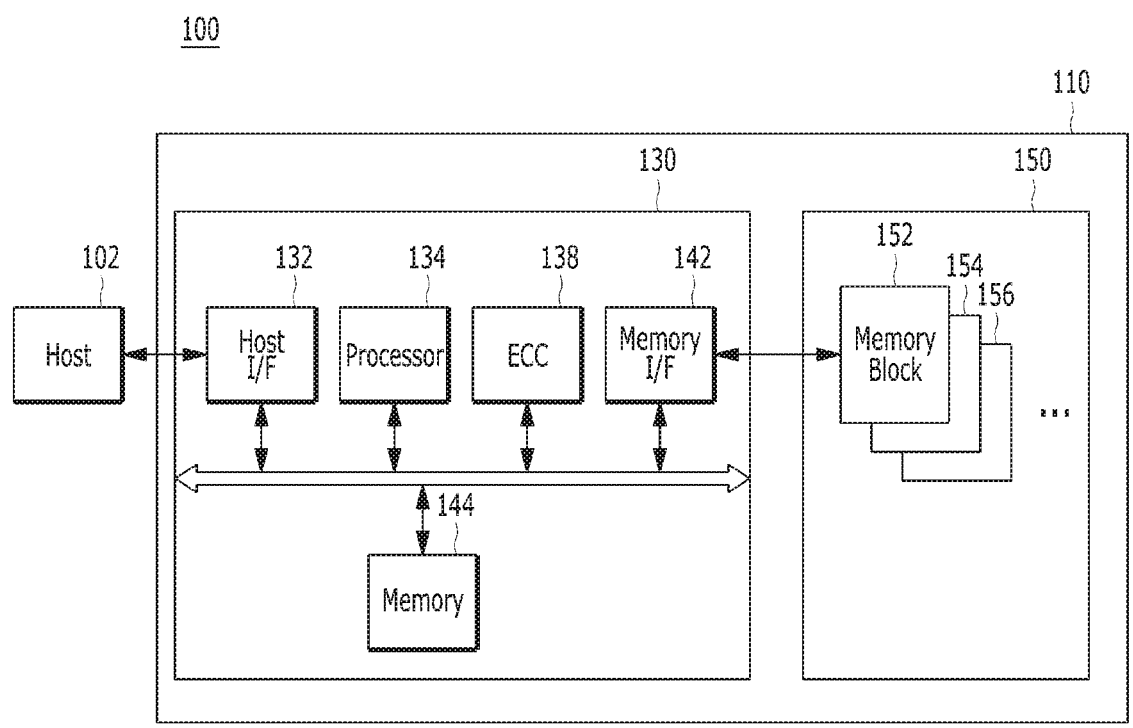
FIG. 1 is a diagram schematically illustrating a data processing system including a memory system in accordance with an embodiment of the disclosure.

Various embodiments are described below in more detail with reference to the accompanying drawings. The present disclosure may, however, be embodied in different forms and thus should not be construed as limited to the embodiments set forth herein. Rather, these embodiments are provided so that this disclosure is thorough and complete, and fully conveys the scope of the present disclosure to those skilled in the art. Throughout the disclosure, like reference numerals refer to like parts throughout the various figures and embodiments of the present disclosure. Also, throughout the specification, reference to "an embodiment," "another embodiment" or the like is not necessarily to only one embodiment, and different references to any such phrase are not necessarily to the same embodiment(s).

FIG. 1 is a diagram schematically illustrating a data processing system including a memory system in accordance with an embodiment of the disclosure.

Referring to FIG. 1, a data processing system 100 may include a host 102 and a memory system 110.

The host 102 includes any of various electronic devices, for example, portable electronic devices such as a mobile phone, an MP3 player and a laptop computer or electronic devices such as a desktop computer, a game machine, a TV and a projector, that is, wired and wireless electronic devices.

The host 102 may include at least one operating system (OS) or a plurality of operating systems, and executes the operating system to perform operations with the memory system 110 in correspondence to a request of a user. The host 102 transmits a plurality of commands corresponding to a user request to the memory system 110, and accordingly, the memory system 110 performs operations corresponding to the commands, that is, operations corresponding to the user request. The operating system generally manages and controls the function and operation of the host 102, and provides interoperability between the host 102 and a user using the data processing system 100 or the memory system 110.

The memory system 110 operates in response to a request of the host 102, and particularly, stores data to be accessed by the host 102, In other words, the memory system 110 may be used as a main memory device or an auxiliary memory device of the host 102. The memory system 110 may be realized as any of various kinds of storage devices (a solid state drive (SSD), an MMC and an eMMC (embedded MMC)), depending on a host interface protocol which is coupled with the host 102.

The storage device(s) used in the memory system 110 may be realized by a volatile memory device such as a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable and programmable ROM (EEPROM), an ferroelectric random access memory (FRAM), a phase change RAM (PRAM), a magnetic RAM (MRAM), a resistive RAM (RRAM) and a flash memory.

The memory system 110 includes a memory device 150 and a controller 130.

The controller 130 and the memory device 150 may be integrated into one semiconductor device and thereby configure an SSD, a PC card (PCMCIA: Personal Computer Memory Card International Association), an SD card (SD, miniSD, microSD and SDHC), and/or a universal flash storage (UFS). Also, for another instance, the memory system 110 may configure one (e.g., a computer, a smartphone or a portable game machine) among various components configuring a computing system.

The memory device 150 in the memory system 110 may maintain stored data even though power is not supplied. In particular, the memory device 150 in the memory system 110 stores data provided from the host 102, through a write operation, and provides stored data to the host 102, through a read operation. The memory device 150 includes a plurality of memory blocks 152, 154 and 156, each of which includes a plurality of pages. Each of the pages includes a plurality of memory cells to which a plurality of word lines (WL) are coupled. Also, the memory device 150 includes a plurality of planes each of which includes the plurality of memory blocks 152, 154 and 156. In particular, the memory device 150 may include a plurality of memory dies each of which includes a plurality of planes. The memory device 150 may be a nonvolatile memory device, for example, a flash memory, and the flash memory may have a 3D stack structure.

The structure of the memory device 150 is described below in more detail with reference to FIGS. 2 and 3. Also, the memory device 150 including a plurality of planes each including the plurality of memory blocks is described below in more detail with reference to FIG. 4.

The controller 130 in the memory system 110 controls the memory device 150 in response to a request from the host 102. For example, the controller 130 provides the data read from the memory device 150, to the host 102, and stores the data provided from the host 102, in the memory device 150. To this end, the controller 130 controls the operations of the memory device 150, such as read, write, program and erase operations.

In more detail, the controller 130 includes a host interface (Host I/F) 132, a processor 134, an error correction code unit (ECC) 138, a memory interface (Memory I/F) 142, and a memory 144.

The host interface 132 may process a command and data of the host 102, and may be configured to communicate with the host 102 through at least one among various interface protocols such as USB (universal serial bus), SATA (serial advanced technology attachment), SCSI (small computer system interface) and ESDI (enhanced small disk interface). The host interface 132 may be driven through firmware which is referred to as a host interface layer (HIL), as a region which exchanges data with the host 102.

The ECC unit 138 may correct an error bit of the data processed in the memory device 150, and may include an ECC encoder and an ECC decoder. The ECC encoder may error correction-encode data to be programmed in the memory device 150 and generate data added with parity bits.

The data added with parity bits may be stored in the memory device 150. The ECC decoder detects and corrects an error included in data read from the memory device 150, in reading data stored in the memory device 150. The ECC unit 138 may perform error correction by using, but not limited to, an LDPC (low density parity check) code, a BCH (Bose, Chaudhuri, Hocquenghem) code, a turbo code, a Reed-Solomon code, a convolution code, an RSC (recursive systematic code), or a coded modulation such as a TCM (trellis-coded modulation) or a BCM (block coded modulation). The ECC unit 138 may be embodied in any suitable configuration, e.g., circuit(s), module(s), system(s) and/or device(s), for error correction.

The memory interface 142 serves as a memory/storage interface which performs interfacing between the controller 130 and the memory device 150, to allow the controller 130 to control the memory device 150 in response to a request from the host 102.

The memory 144, as the working memory of the memory system 110 and the controller 130, stores data for driving of the memory system 110 and the controller 130.

The memory 144 may be realized by a volatile memory. For example, the memory 144 may be realized by a static random access memory (SRAM) or a dynamic random access memory (DRAM). Furthermore, the memory 144 may be disposed within the controller 130. Alternatively, the memory 144 may disposed externally to the controller 130, in which case, the memory 144 may be realized as an external volatile memory configured to exchange data with the controller 130 through a memory interface.

The memory 144 stores data necessary to perform data write and read operations between the host 102 and the memory device 150 and data when performing the data write and read operations. For such data storage, the memory 144 includes a program memory, a data memory, a write buffer/cache, a read buffer/cache, a data buffer/cache, a map buffer/cache, and so forth.

The processor 134 controls the general operations of the memory system 110, and particularly, controls a program operation or a read operation for the memory device 150, in response to a write request or a read request from the host 102. The processor 134 drives firmware which is referred to as a flash translation layer (FTL), to control general operations of the memory system 110. The processor 134 may be realized by a microprocessor or a central processing unit (CPU).

The controller 130 performs an operation requested from the host 102, in the memory device 150, that is, performs a command operation corresponding to a command received from the host 102, with the memory device 150, through the processor 134. Also, the controller 130 may perform a background operation for the memory device 150. The background operation for the memory device 150 includes a garbage collection (GC) operation, a wear leveling (WL) operation, a map flush operation, a bad block management operation, or the like.

Hereinbelow, the memory device in the memory system in accordance with the embodiment of the disclosure is described in more detail with reference to FIGS. 2 and 3.

Figure 2:
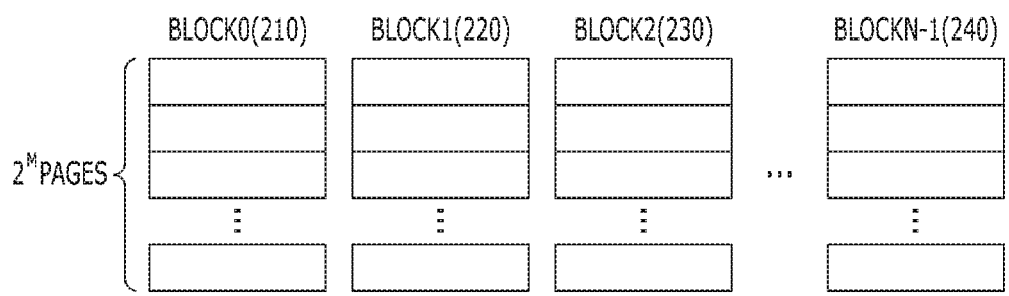
FIG. 2 is a diagram schematically illustrating a memory device in the memory system in accordance with the embodiment of the disclosure.
Figure 3:
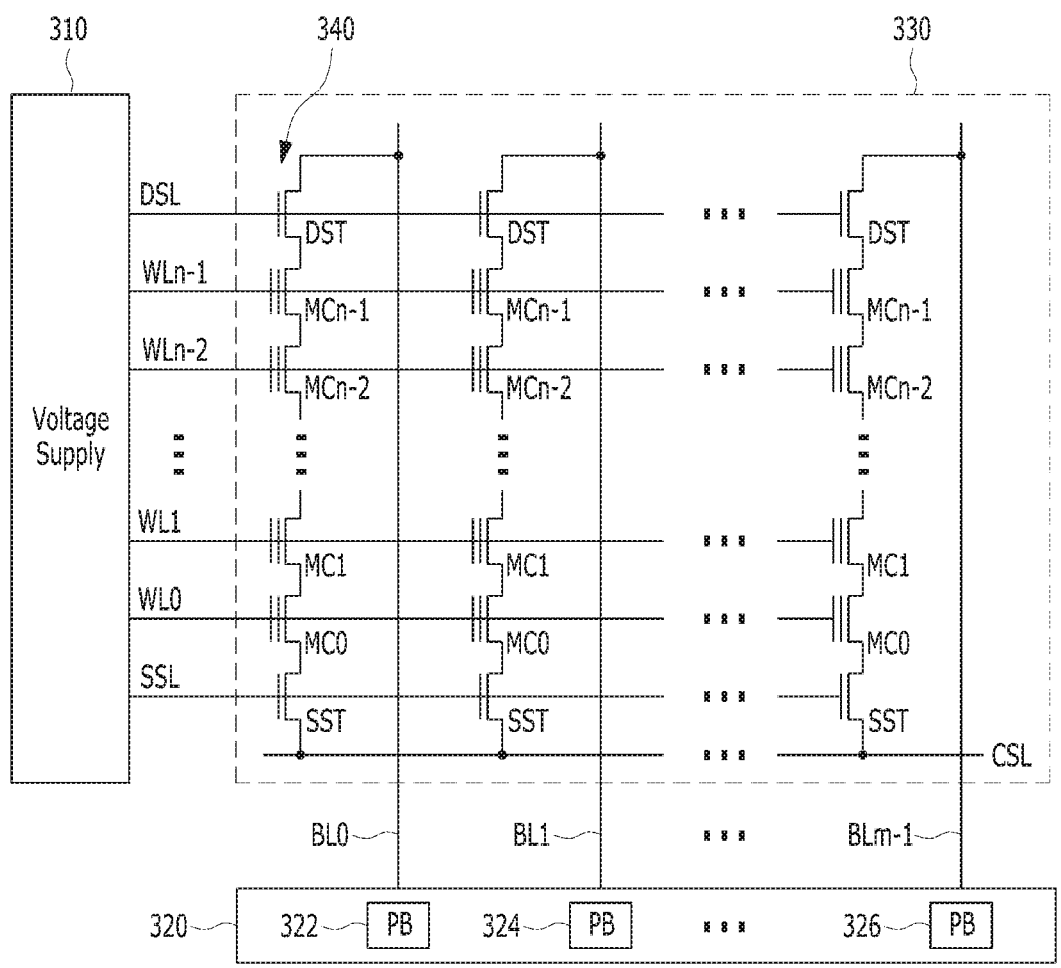
FIG. 3 is a diagram schematically illustrating a memory cell array circuit of a memory block in a memory device in accordance with an embodiment of the disclosure.

FIG. 2 is a diagram schematically illustrating a memory device in the memory system in accordance with the embodiment of the disclosure, and FIG. 3 is a diagram schematically illustrating a memory cell array circuit of a memory block in a memory device in accordance with an embodiment of the disclosure.

First, referring to FIG. 2, the memory device 150 includes a plurality of memory blocks, for example, a zeroth block (BLOCK0) 210, a first block (BLOCK1) 220, a second block (BLOCK2) 230 and an (N−1)th block (BLOCKN−1) 240. Each of the blocks 210, 220, 230 and 240 includes a plurality of pages, for example, $2^M$ pages or M pages. Each of the pages includes a plurality of memory cells to which a plurality of word lines (WL) are coupled.

Also, depending on the number of bits stored in one memory cell, the memory device 150 may include a single level cell (SLC) memory block including a plurality of pages realized by memory cells each storing 1-bit data, a multi-level cell (MLC) memory block including a plurality of pages realized by memory cells each capable of storing 2-bit data, a triple level cell (TLC) memory block including a plurality of pages realized by memory cells each capable of storing 3-bit data, a quadruple level cell (QLC) memory block including a plurality of pages realized by memory cells each capable of storing 4-bit data, a higher level cell memory block including a plurality of pages realized by memory cells each capable of storing 5 or more-bit data, or the like.

While that the description below is given in the context in which the memory device 150 is realized by a nonvolatile memory such as a flash memory, for example, a NAND flash memory, it is to be noted that the memory device 150 may be implemented as any of various types of memories such as a phase change memory (PCRAM: phase change random access memory), a resistive memory (RRAM (ReRAM): resistive random access memory), a ferroelectric memory (FRAM: ferroelectric random access memory) and/or a spin transfer torque magnetic memory (STT-RAM (STT-MRAM): spin transfer torque magnetic random access memory).

Each of the memory blocks 210, 220, 230 and 240 stores the data provided from the host device 102, through a program operation, and provides stored data to the host 102, through a read operation.

Next, referring to FIG. 3, among the plurality of memory blocks 152, 154 and 156 included in the memory device 150 of the memory system 110, each memory cell array 330 may include a plurality of cell strings 340 which are realized as a memory cell array and are coupled to bit lines BL0 to BLm−1, respectively. The cell string 340 of each column may include at least one drain select transistor DST and at least one source select transistor SST. A plurality of memory cells or memory cell transistors MC0 to MCn−1 may be coupled in series between the select transistors DST and SST. The respective memory cells MC0 to MCn−1 may be constructed by multi-level cells (MLC) each of which stores data information of a plurality of bits. The cell strings 340 may be electrically coupled to corresponding bit lines BL0 to BLm−1, respectively.

While FIG. 3 shows, as an example, a memory cell array 330 constructed by NAND flash memory cells, it is to be noted that each of the plurality of memory blocks 152,154, 156 included in the memory device 150 may be configured for other types of memories, e.g., a NOR flash memory, a hybrid flash memory in which at least two kinds of memory cells are combined or a one-NAND flash memory in which a controller is built in a memory chip.

A voltage supply circuit 310 of the memory device 150 may provide word line voltages (for example, a program voltage, a read voltage and a pass voltage) to be supplied to respective word lines according to an operation mode and voltages to be supplied to bulks (for example, well regions) formed with memory cells. The voltage generating operation of the voltage supply circuit 310 may be performed under the control of a control circuit (not shown). The voltage supply circuit 310 may generate a plurality of variable read voltages to generate a plurality of read data, select one of the memory blocks (or sectors) of a memory cell array in response to the control of the control circuit, select one of the word lines of the selected memory block, and provide the word line voltages to the selected word line and unselected word lines.

A read/write circuit 320 of the memory device 150 is controlled by the control circuit, and may operate as a sense amplifier or a write driver according to an operation mode. For example, in a verify/normal read operation, the read/write circuit 320 may operate as a sense amplifier for reading data from the memory cell array. Also, in a program operation, the read/write circuit 320 may operate as a write driver which drives bit lines according to data to be stored in the memory cell array. In the program operation, the read/write circuit 320 may receive data to be written in the memory cell array, from a buffer (not shown), and may drive the bit lines according to inputted data. To this end, the read/write circuit 320 may include a plurality of page buffers (PB) 322, 324 and 326 respectively corresponding to columns (or bit lines) or pairs of columns (or pairs of bit lines), and a plurality of latches (not shown) may be included in each of the page buffers 322, 324 and 326.

Figure 4:
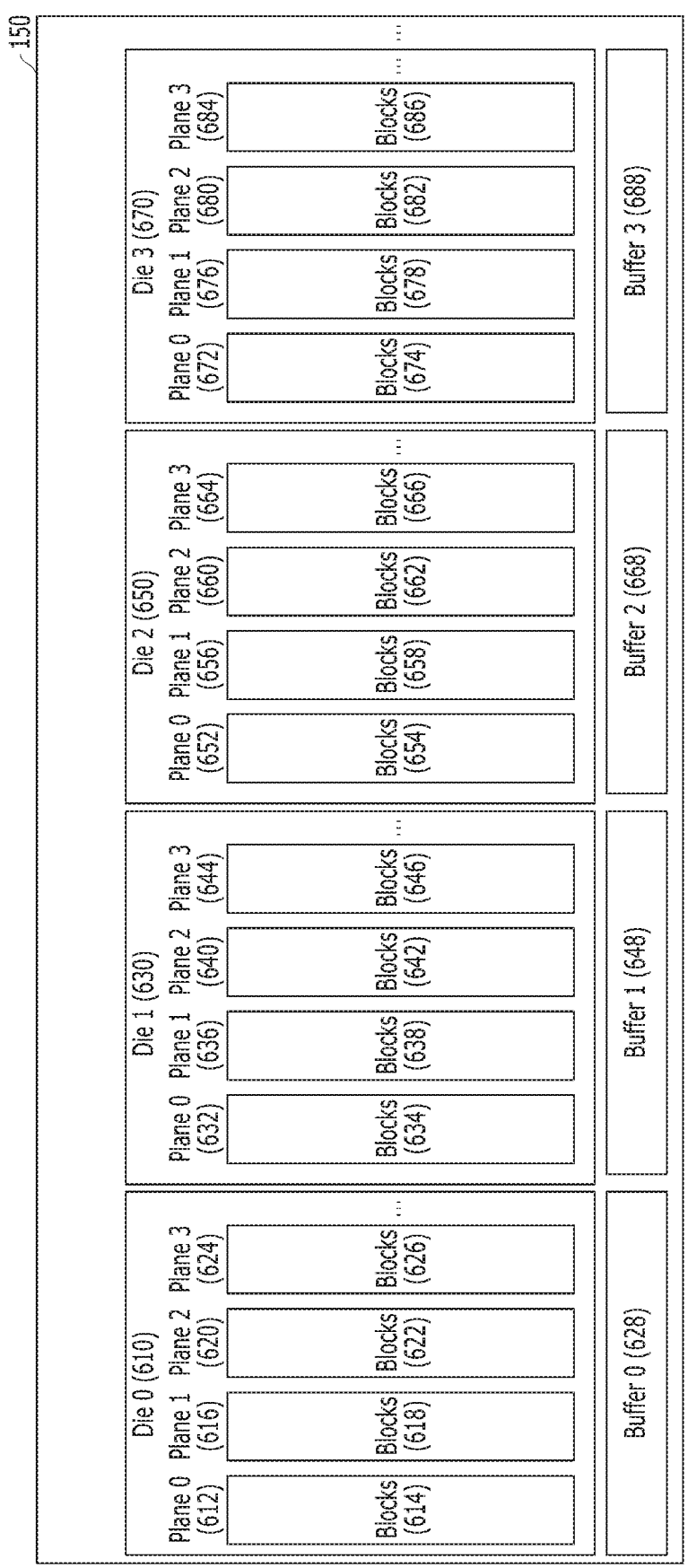
FIG. 4 is a diagram to assist in the explanation of a memory device including a plurality of planes each including a plurality of memory blocks.

FIG. 4 is a diagram to assist in the explanation of a memory device including a plurality of planes each including a plurality of memory blocks.

Referring to FIG. 4, the memory device 150 includes a plurality of memory dies, for example, a memory die 0 610, a memory die 1 630, a memory die 2 650 and a memory die 3 670. Each of the memory dies 610, 630, 650 and 670 includes a plurality of planes. For example, the memory die 0 610 includes a plane 0 612, a plane 1 616, a plane 2 620 and a plane 3 624, the memory die 1 630 includes a plane 0 632, a plane 1 636, a plane 2 640 and a plane 3 644, the memory die 2 650 includes a plane 0 652, a plane 1 656, a plane 2 660 and a plane 3 664, and the memory die 3 670 includes a plane 0 672, a plane 1 676, a plane 2 680 and a plane 3 684. The planes 612, 616, 620, 624, 632, 636, 640, 644, 652, 656, 660, 664, 672, 676, 680 and 684 in the memory dies 610, 630, 650 and 670 include a plurality of memory blocks 614, 618, 622, 626, 634, 638, 642, 646, 654, 658, 662, 666, 674, 678, 682 and 686, respectively. Each memory block includes a plurality of pages, for example, 2^M pages, as described above with reference to FIG. 2. Moreover, the memory device 150 includes a plurality of buffers corresponding to the respective memory dies 610, 630, 650 and 670, for example, a buffer 0 628 corresponding to the memory die 0 610, a buffer 1 648 corresponding to the memory die 1 630, a buffer 2 668 corresponding to the memory die 2 650, and a buffer 3 688 corresponding to the memory die 3 670.

In performing command operations corresponding to a plurality of commands received from the host 102, data corresponding to the command operations are stored in the buffers 628, 648, 668 and 688 in the memory device 150. For example, in performing program operations, data corresponding to the program operations are stored in the buffers 628, 648, 668 and 688, and are then stored in the pages in the memory blocks of the memory dies 610, 630, 650 and 670. In performing read operations, data corresponding to the read operations are read from the pages in the memory blocks of the memory dies 610, 630, 650 and 670, are stored in the buffers 628, 648, 668 and 688, and are then provided to the host 102 through the controller 130.

In the embodiment of FIG. 4, the buffers 628, 648, 668 and 688 included in the memory device 150 are disposed outside the corresponding memory dies 610, 630, 650 and 670, respectively. However, according to another embodiment, the buffers 628, 648, 668 and 688 may be included within the corresponding memory dies 610, 630, 650 and 670, respectively. Further, according to an embodiment, the plurality of buffers 628, 648, 668 and 688 may correspond to the respective sets of planes or to the respective groups of memory blocks in the respective memory dies 610, 630, 650 and 670. Further, while in the example described below, the buffers 628, 648, 668 and 688 correspond to the plurality of page buffers 322, 324 and 326, respectively, it is to be noted that the buffers 628, 648, 668 and 688 may be realized as a plurality of caches or a plurality of registers in the memory device 150.

Figure 5:
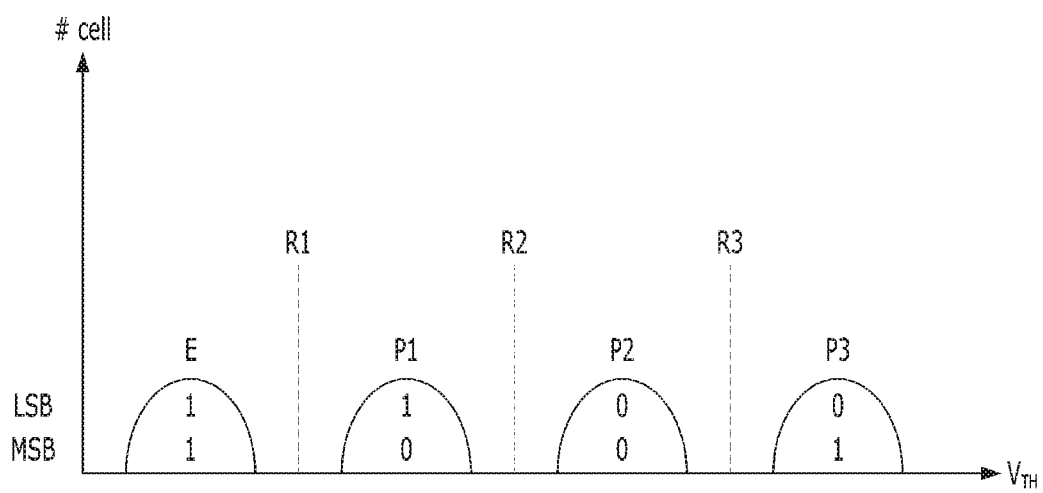
FIG. 5 is a threshold voltage distribution graph illustrating program states and an erase state of an MLC memory device.

FIG. 5 is a threshold voltage distribution graph illustrating program states and an erase state of an MLC memory device.

In an MLC memory device, one memory cell may store 2-bit data configured by a most significant bit (MSB) and a least significant bit (LSB). In the MLC memory device, each of memory cells has a threshold voltage in one state among an erase state E and first to third program states P1 to P3 as illustrated in FIG. 5, depending on a value of programmed data. A memory cell in which 2-bit data including an MSB having a value of '1' and an LSB also having a value of '1,' that is, data having a value of '11,' is programmed has a threshold voltage in the erase state E. In the same manner, memory cells in which data having values of '01,' '00' and '10' are respectively programmed have threshold voltages in the first to third program states P1 to P3, respectively.

A flash memory performs a read operation in the unit of page, and one page may include a plurality of memory cells. The page may be physically 'one,' but may conceptually include first and second logic pages corresponding to LSBs and MSBs, respectively. The first logic page may store LSB data, and the second logic page may store MSB data. The LSB data and the MSB data mean data corresponding to an LSB and an MSB, respectively, of 2-bit data stored in a memory cell. The controller 130 may identify memory cells whose LSBs have a value of '1' and memory cells whose LSBs have a value of '0,' by applying an LSB read voltage corresponding to the first logic page, and may identify memory cells whose MSBs have a value of '0' and memory cells whose MSBs have a value of '1,' by applying MSB read voltages corresponding to the second logic page. In the case of the threshold voltage distributions of the MLC memory device illustrated in FIG. 5, the number of LSB read voltage may be one, and the number of MSB read voltages may be two.

In detail, referring to FIG. 5, memory cells whose LSBs have a value of '1' and memory cells whose LSBs have a value of '0' may be identified by a second read voltage R2 which is set to a voltage level between threshold voltage distributions corresponding to the first and second program states P1 and P2, respectively. For example, the controller 130 may read the first logic page by applying the second read voltage R2 as the LSB read voltage. The controller 130 may determine that each of memory cells turned on as a result of reading the first logic page has a threshold voltage included in one state of the erase state E and the first program state P1. The controller 130 may identify the turned-on memory cells as memory cells whose LSBs have a value of '1.' The controller 130 may determine that each of memory cells turned off as a result of reading the first logic page has a threshold voltage included in one state of the second and third program states P2 and P3. The controller 130 may identify the turned-off memory cells as memory cells whose LSBs have a value of '0.'

Memory cells whose MSBs have a value of '1' and memory cells whose MSBs have a value of '0' may be identified by first and third read voltages R1 and R3. For example, MSB values of memory cells which are identified as having threshold voltages included in one state of the erase state E and the first program state P1 as a result of reading the first logic page may be identified by the first read voltage R1 which is set to a voltage level between the threshold voltage distributions representing the erase state E1 and the first program state P1, respectively. The controller 130 may read the second logic page by applying the first read voltage R1 as the MSB read voltage. The controller 130 may determine that each of memory cells turned on as a result of reading the second logic page, among the memory cells whose LSBs are identified as having a value of '1,' has a threshold voltage included in the erase state E. The controller 130 may identify the turned-on memory cells as memory cells whose MSBs have a value of '1.' The controller 130 may determine that each of turned-off memory cells has a threshold voltage included in the first program state P1. The controller 130 may identify the turned-off memory cells as memory cells whose MSBs have a value of '0.'

In the same manner, the controller 130 may read the second logic page by applying the third read voltage R3 as the MSB read voltage. The controller 130 may determine that each of memory cells turned on as a result of reading the second logic page, among the memory cells whose LSBs are identified as having a value of '0,' has a threshold voltage included in the second program state P2. The controller 130 may identify the turned-on memory cells as memory cells whose MSBs have a value of '0.' The controller 130 may determine that each of memory cells turned off as a result of reading the second logic page, among the memory cells whose LSBs are identified as having a value of '0,' has a threshold voltage included in the third program state P3. The controller 130 may identify the turned-off memory cells as memory cells whose MSBs have a value of '1.'

Figure 6:
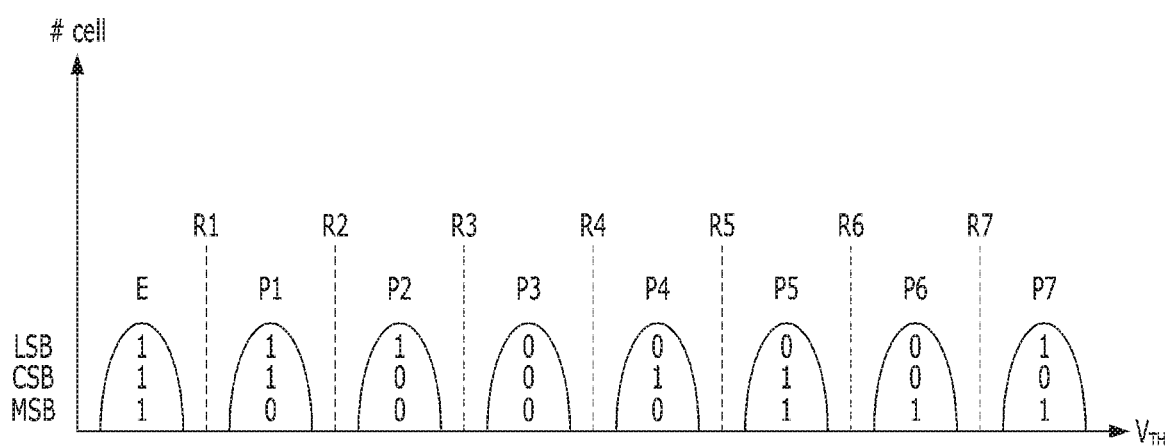
FIG. 6 is a threshold voltage distribution graph illustrating program states and an erase state of a TLC memory device.

FIG. 6 is a threshold voltage distribution graph illustrating program states and an erase state of a TLC memory device.

In a TLC memory device, one memory cell may store 3-bit data configured by a most significant bit (MSB), a central significant bit (CSB) and a least significant bit (LSB). In the TLC memory device, each of memory cells has a threshold voltage in one state among an erase state E and first to seventh program states P1 to P7 as illustrated in FIG. 6, depending on a value of programmed data. A memory cell in which 3-bit data including an MSB, a CSB and an LSB all having a value of '1,' that is, data having a value of '111,' is programmed has a threshold voltage in the erase state E. In the same manner, memory cells in which data having values of '011,' '001,' '000,' '010,' '110,' '100' and '101' are respectively programmed have threshold voltages which are included in the first to seventh program states P1 to P7, respectively.

In a TLC memory device, one page may be physically 'one,' but may conceptually include first to third logic pages corresponding to LSBs, CSBs and MSBs, respectively. The first to third logic pages may store LSB data, CSB data and MSB data, respectively. The controller 130 may identify memory cells whose LSBs have a value of '1' and memory cells whose LSBs have a value of '0,' by applying LSB read voltages corresponding to the first logic page, and may identify memory cells whose CSBs have a value of '1' and memory cells whose CSBs have a value of '0,' by applying CSB read voltages corresponding to the second logic page. Also, the controller 130 may identify memory cells whose MSBs have a value of '1' and memory cells whose MSBs have a value of '0,' by applying MSB read voltages corresponding to the third logic page. In the threshold voltage distributions of the TLC memory device illustrated in FIG. 6, the number of LSB read voltages may be two, the number of CSB read voltages may be three and the number of MSB read voltages may be two.

In detail, memory cells whose LSBs have a value of '1' and memory cells whose LSBs have a value of '0' may be identified by a third read voltage R3 which is set to a voltage level between threshold voltage distributions representing the second and third program states P2 and P3, respectively, and a seventh read voltage R7 which is set to a voltage level between threshold voltage distributions representing the sixth and seventh program states P6 and P7, respectively. For example, the controller 130 may read the first logic page by applying the third read voltage R3 as the LSB read voltage. The controller 130 may determine that each of memory cells turned on as a result of reading the first logic page has a threshold voltage included in one state among the erase state E, the first program state P1 and the second program state P2. The controller 130 may identify the turned-on memory cells as memory cells whose LSBs have a value of '1.'

The controller 130 may determine that each of memory cells turned off as a result of reading the first logic page by applying the seventh read voltage R7 as the LSB read voltage has a threshold voltage included in the seventh program state P7. The controller 130 may identify the turned-off memory cells as memory cells whose LSBs have a value of '1.' The controller 130 may determine that each of memory cells turned off as the result of reading the first logic page by applying the third read voltage R3 as the LSB read voltage and turned on as the result of reading the first logic page by applying the seventh read voltage R7 as the LSB read voltage has a threshold voltage included in any one state among the third to sixth program states P3 to P6. The controller 130 may identify the memory cells as memory cells whose LSBs have a value of '0.'

Memory cells whose CSBs have a value of '1' and memory cells whose CSBs have a value of '0' may be identified by second, fourth and sixth read voltages R2, R4 and R6. For example, values of CSBs of the memory cells identified as having threshold voltages included in one state among the erase state E, the first program state P1 and the second program state P2 may be identified by the second read voltage R2. The second read voltage R2 may be set to a voltage level between threshold voltage distributions representing the first program state P1 and the second program state P2, respectively. The controller 130 may determine that each of memory cells turned on as a result of reading the second logic page by applying the second read voltage R2 as the CSB read voltage, among the memory cells identified as having threshold voltages included in one state among the erase state E, the first program state P1 and the second program state P2, has a threshold voltage included in one state of the erase state E and the first program state P1. The controller 130 may identify the turned-on memory cells as memory cells whose CSBs have a value of '1.' The controller 130 may determine that each of turned-off memory cells has a threshold voltage included in the second program state P2. The controller 130 may identify the turned-off memory cells as memory cells whose CSBs have a value of '0.'

Values of CSBs of the memory cells identified as having threshold voltages included in the third to sixth program states P3 to P6 may be identified by the fourth and sixth read voltages R4 and R6. The fourth read voltage R4 may be set to a voltage level between threshold voltage distributions representing the third and fourth program states P3 and P4, respectively, and the sixth read voltage R6 may be set to a voltage level between threshold voltage distributions representing the fifth and sixth program states P5 and P6, respectively. The controller 130 may determine that each of memory cells turned on as a result of reading the second logic page by applying the fourth read voltage R4 as the CSB read voltage, among the memory cells identified as having threshold voltages included in the third to sixth program states P3 to P6, has a threshold voltage included in the third program state P3. The controller 130 may identify the turned-on memory cells as memory cells whose CSBs have a value of '0.'

The controller 130 may determine that each of memory cells turned off as a result of reading the second logic page by applying the sixth read voltage R6 as the CSB read voltage, among the memory cells identified as having threshold voltages included in the third to sixth program states P3 to P6, has a threshold voltage included in the sixth program state P6. The controller 130 may identify the turned-off memory cells as memory cells whose CSBs have a value of '0.' The controller 130 may determine that each of memory cells turned off as the result of reading the second logic page by applying the fourth read voltage R4 as the CSB read voltage and turned on as the result of reading the second logic page by applying the sixth read voltage R6 as the CSB read voltage, among the memory cells identified as having threshold voltages included in the third to sixth program states P3 to P6, has a threshold voltage included in one state of the fourth and fifth program states P4 and P5. The controller 130 may identify the memory cells as memory cells whose CSBs have a value of '1.'

Memory cells whose MSBs have a value of '1' and memory cells whose MSBs have a value of '0' may be identified by first and fifth read voltages R1 and R5. For example, the memory cells identified as having one state of the erase state E and the first program state P1 may be identified by the first read voltage R1. The first read voltage R1 may be set to a voltage level between threshold voltage distributions representing the erase state E and the first program state P1, respectively. The controller 130 may determine that each of memory cells turned on as a result of reading the third logic page by applying the first read voltage R1 as the MSB read voltage, among the memory cells identified as having threshold voltages included in one state of the erase state E and the first program state P1, has a threshold voltage included in the erase state E. The controller 130 may identify the turned-on memory cells as memory cells whose MSBs have a value of '1.' The controller 130 may determine that each of turned-off memory cells has a threshold voltage included in the first program state P1. The controller 130 may identify the turned-off memory cells as memory cells whose MSBs have a value of '0.'

The memory cells identified as having one state of the fourth and fifth program states P4 and P5 may be identified by the fifth read voltage R5. The fifth read voltage R5 may be set to a voltage level between threshold voltage distributions representing the fourth and fifth program states P4 and P5, respectively. The controller 130 may determine that each of memory cells turned on as a result of reading the third logic page by applying the fifth read voltage R5 as the MSB read voltage, among the memory cells identified as having threshold voltages included in one state of the fourth and fifth program states P4 and P5, has a threshold voltage included in the fourth program state P4. The controller 130 may identify the turned-on memory cells as memory cells whose MSBs have a value of '0.' The controller 130 may determine that each of turned-off memory cells has a threshold voltage included in the fifth program state P5. The controller 130 may identify the turned-off memory cells as memory cells whose MSBs have a value of '1.'

The read environment of a flash memory may vary due to read disturbance or the retention characteristic of the flash memory. As the read environment varies, threshold voltage distributions may shift. When a read operation is performed using read levels optimized for the existing threshold voltage distributions, after the threshold voltage distributions shift, a read error may occur. The ECC unit 138 described above with reference to FIG. 1 may detect and correct the read error. If the number of error bits becomes greater than a threshold, the read error may not be corrected. Therefore, the controller 130 may correct the read error through controlling the memory device 150 to perform a read retry operation of performing a read operation again by changing read levels based on read bias sets recorded in a read retry table or an additional read operation of performing a read operation by using read levels optimized for varied threshold voltage distributions.

Figure 7:
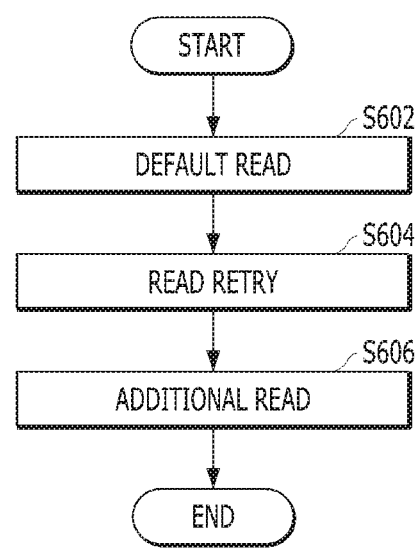
FIG. 7 is a flow chart illustrating read operations generally performed when an uncorrectable error occurs.

FIG. 7 is a flow chart illustrating read operations generally performed when an uncorrectable error occurs.

At step S602, the controller 130 may control the memory device 150 to perform a default read operation DEFAULT READ in response to a read command provided from the host 102. The default read operation DEFAULT READ means a read operation that is first performed on a memory block corresponding to a physical address mapped to a logical address of the read command, by using initial read levels (default read levels), which may be determined in advance. The controller 130 may control the memory device 150 to perform the default read operation DEFAULT READ by applying read voltages having the default read levels, respectively, according to a set order (a default read voltage application order), which order may be determined in advance.

For example, as described above with reference to FIG. 5, in the MLC memory device, three read voltages are required to identify a value of MSB data and a value of LSB data stored in each memory cell. The second read voltage R2 may be used to identify a value of LSB data in a read operation on the first logic page, and the first and third read voltages R1 and R3 may be used to identify a value of MSB data in a read operation on the second logic page. According to an embodiment, in the MLC memory device, the read operation on the second logic page may be performed after the read operation on the first logic page is performed. Since only the second read voltage R2 exists as a read voltage to be used in the read operation on the first logic page, there is no read voltage application order. In the read operation on the second logic page, an MSB default read voltage application order may be the order of the first read voltage R1 and the third read voltage R3. The controller 130 may control the memory device 150 to perform the default read operation DEFAULT READ of performing the read operation on the first logic page and then performing the read operation on the second logic page by sequentially applying the first and third read voltages R1 and R3 in the order of the first read voltage R1 and the third read voltage R3 according to the MSB default read voltage application order.

Further, as described above with reference to FIG. 6, in the TLC memory device, seven read voltages are required to identify a value of LSB data, a value of CSB data and a value of MSB data stored in each memory cell. The third and seventh read voltages R3 and R7 may be used to identify a value of LSB data in a read operation on the first logic page, and the second, fourth and sixth read voltages R2, R4 and R6 may be used to identify a value of CSB data in a read operation on the second logic page. The first and fifth read voltages R1 and R5 may be used to identify a value of MSB data in a read operation on the third logic page. According to an embodiment, in the TLC memory device, the read operations on the first to third logic pages may be sequentially performed. In the read operation on the first logic page, an LSB default read voltage application order may be the order of the third read voltage R3 and the seventh read voltage R7, and in the read operation on the second logic page, a CSB default read voltage application order may be the order of the second read voltage R2, the fourth read voltage R4 and the sixth read voltage R6. In the read operation on the third logic page, an MSB default read voltage application order may be the order of the first read voltage R1 and the fifth read voltage R5. The controller 130 may perform the read operation on the first logic page by sequentially applying the third and seventh read voltages R3 and R7 according to the LSB default read voltage application order, and then, may perform the read operation on the second logic page by sequentially applying the second, fourth and sixth read voltages R2, R4 and R6 according to the CSB default read voltage application order. Thereafter, the controller 130 may perform the read operation on the third logic page by sequentially applying the first and fifth read voltages R1 and R5 according to the MSB default read voltage application order. The controller 130 may control the memory device 150 to perform the default read operation DEFAULT READ of sequentially performing the read operations on the first to third logic pages according to LSB default read voltages, CSB default read voltages and MSB default read voltages.

At step S604, when the default read operation DEFAULT READ performed at the step S602 fails, the controller 130 may control the memory device 150 to perform a read retry operation READ RETRY. The controller 130 may control the memory device 150 to sequentially perform read operations until the read retry operation succeeds, by using read levels included in each of a plurality of read bias sets included in a read retry table. Since the read retry operation READ RETRY may include as many read operations, e.g., as many as the number of read bias sets, when the read retry operation READ RETRY is performed as the default read operation DEFAULT READ fails, it may take a long time to output read data for the read command, to the host 102. Therefore, as is described below, whether or not the read operation succeeds in the default read step (the step S602) may be directly related to the performance of the read operation.

At step S606, when the read retry operation READ RETRY performed at the step S604 fails, the controller 130 may control the memory device 150 to perform an additional read operation ADDITIONAL READ of searching for optimal read voltages based on various algorithms. For example, the controller 130 may search for the optimal read voltage by setting a read voltage to have a middle value of respective peak values of adjacent threshold voltage distributions according to a Gaussian modeling algorithm. Also, the controller 130 may read specific data at least twice and search for the optimal read voltage based on a read result.

As described above, the controller 130 may sequentially perform a default read operation, a read retry operation and an additional read operation until a read error is corrected, and thereby, may output read data to the host 102. A time required for a read operation means a time from a time point when the controller 130 receives a read command to a time point when the controller 130 outputs read data to the host 102. Therefore, when the default read operation first performed succeeds, the time required for the read operation may be shortened since the read retry operation and the additional read operation are not performed. Therefore, whether the default read operation succeeds or not may be directly related to the performance of the read operation.

Figure 8:
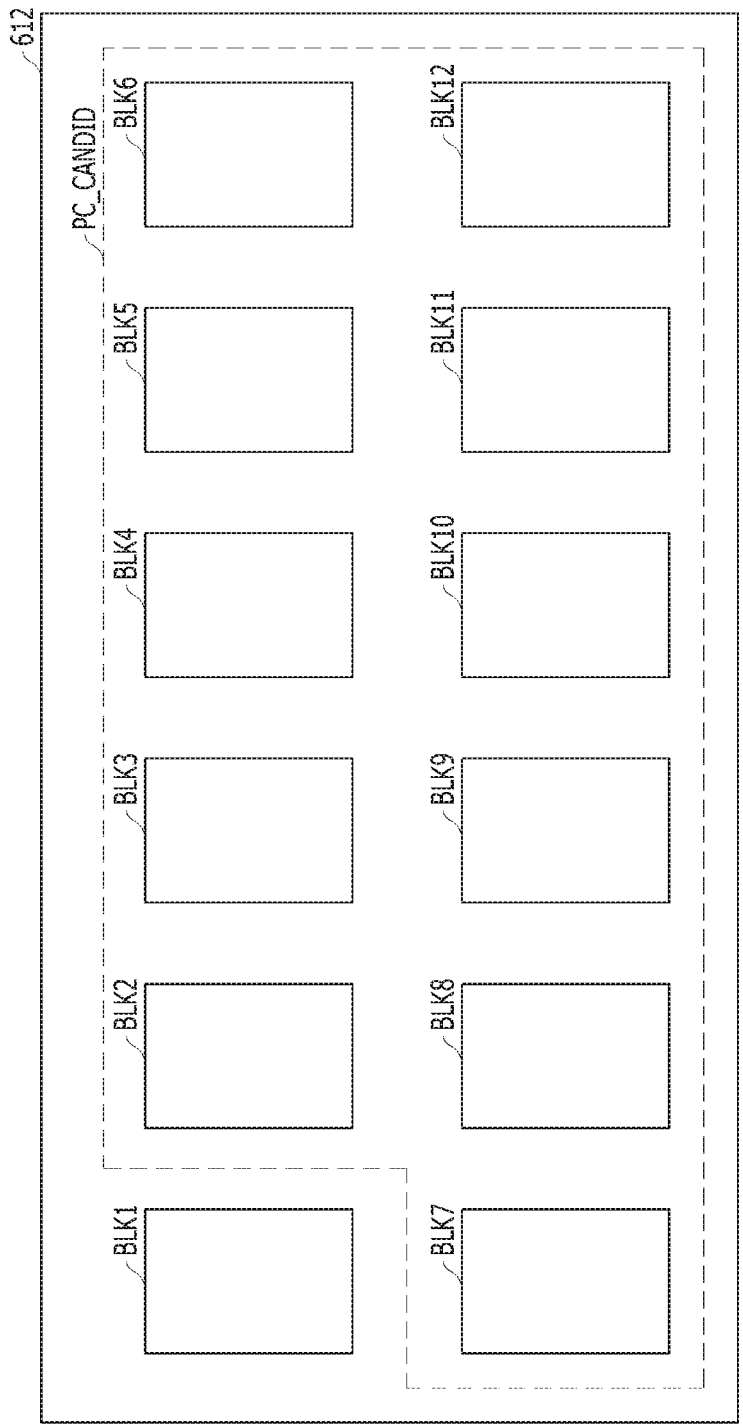
FIG. 8 is a diagram to assist in the explanation of a phenomenon in which the number of read errors sharply increases in a default read operation first performed on a problem occurrence candidate block after a problem-causing operation is performed.

FIG. 8 is a diagram to assist in the explanation of a phenomenon in which the number of read errors sharply increases in a default read operation first performed on a problem occurrence candidate block after a problem-causing operation is performed.

FIG. 8 is described below, by way of example, in the context in which the zeroth plane 612 includes first to twelfth memory blocks BLK1 to BLK12, unlike the depiction of the zeroth plane 612 in FIG. 4.

After a program operation or an erase operation (hereinafter, a problem-causing operation) is performed on the first memory block BLK1 as one memory block among the plurality of memory blocks BLK1 to BLK12 included in the same plane 612, there occurs a phenomenon in which the number of read errors sharply increases in a default read operation first performed on the second memory block BLK2 as any one memory block among the remaining memory blocks (hereinafter, a problem occurrence candidate group PC_CANDID) except the first memory block BLK1.

In detail, after the problem-causing operation is performed on the first memory block BLK1, the default read operation first performed on the second memory block BLK2 causes a large number of error bits. When the number of error bits sharply increases, the default read operation may fail because the errors having occurred according to the default read operation may not be corrected, and the controller 130 may enter read retry step.

However, the phenomenon in which the number of read errors sharply increases may be temporary. For example, the number of read errors sharply increases only in the default read operation first performed on the problem occurrence candidate group PC_CANDID after the problem-causing operation is performed. In detail, the number of read errors may sharply increase only in a first default read operation first performed on a first page of the second memory block BLK2 as any one memory block of the problem occurrence candidate group PC_CANDID after the problem-causing operation is performed on the first memory block BLK1, and the number of read errors may decrease again in a second default read operation on a second page of the second memory block BLK2 performed after the first default read operation. The number of error bits having occurred in the second default read operation may be significantly lower than that in the first default read operation.

The first and second pages may be arbitrary pages included in the second memory block BLK2, or may be the same page. In addition, read levels used in the first and second default read operations may have the same magnitudes as default read levels, and orders of applying the read levels may be the same as each other as a default read voltage application order.

The above-described problem may occur because, as the problem-causing operation is performed on an arbitrary memory block BLK1 included in a certain plane 612, threshold voltage distributions for the problem occurrence candidate group PC_CANDID included in the plane 612 temporarily shift. The threshold voltage distributions temporarily having shifted in a memory block included in the problem occurrence candidate group PC_CANDID may be recovered to original distributions when a read operation is performed on the memory block after the threshold voltage distributions have shifted. For example, when threshold voltage distributions of the second memory block BLK2 of the problem occurrence candidate group PC_CANDID temporarily have shifted due to the problem-causing operation, the threshold voltage distributions may be recovered to original distributions when a read operation is performed on an arbitrary page included in the second memory block BLK2.

As described above with reference to FIG. 2, in an MLC memory device or a TLC memory device, by using a plurality of read voltages, it is possible to identify that each of memory cells has a threshold voltage included in which state among a plurality of states. For example, as described above with reference to the step S602 of FIG. 7, in the MLC memory device, the controller 130 may identify, by using the first to third read voltages R1 to R3, that each memory cell has a threshold voltage included in which state among the erase state and the first to third program states. Also, in the TLC memory device, the controller 130 may identify, by using the first to seventh read voltages R1 to R7, that each memory cell has a threshold voltage included in which state among the erase state and the first to seventh program states. As described above, in the default read operation, the controller 130 may apply read voltages having default read levels in a default read voltage application order. For instance, in the MLC memory device, the MSB default read voltage application order may be the order of the first read voltage R1 and the third read voltage R3. Further, for instance, in the TLC memory device, the LSB default read voltage application order may be the order of the third read voltage R3 and the seventh read voltage R7, the CSB default read voltage application order may be the order of the second read voltage R2, the fourth read voltage R4 and the sixth read voltage R6, and the MSB default read voltage application order may be the order of the first read voltage R1 and the fifth read voltage R5.

While the plurality of read voltages are sequentially applied, the threshold voltage distributions may be recovered to the original distributions. Each time each of the plurality of read voltages is applied, the threshold voltage distributions may shift to be similar to the original threshold voltage distributions. For example, in the MLC memory device, second threshold voltage distributions as threshold voltage distributions of memory cells of the second memory block BLK2 after a read operation is performed on the first logic page of the second memory block BLK2 by applying the second read voltage R2 after the problem-causing operation is performed may be more similar to the original threshold voltage distributions than first threshold voltage distributions as threshold voltage distributions of the memory cells of the second memory block BLK2 immediately after the problem-causing operation is performed on the first memory block BLK1. The original threshold voltage distributions may be threshold voltage distributions for the memory cells of the second memory block BLK2 before the problem-causing operation is performed. Further, third threshold voltage distributions as threshold voltage distributions of the memory cells of the second memory block BLK2 after a read operation is performed on the second logic page by applying the first read voltage R1 as the MSB read voltage may be more similar to the original threshold voltage distributions than the second threshold voltage distributions. Fourth threshold voltage distributions as threshold voltage distributions of the memory cells of the second memory block BLK2 after a read operation is performed on the second logic page by applying the third read voltage R3 as the MSB read voltage may be most similar to the original threshold voltage distributions.

In the same manner, in the TLC memory device, first threshold voltage distributions as threshold voltage distributions of the memory cells of the second memory block BLK2 immediately after the problem-causing operation is performed on the first memory block BLK1 may be different from original threshold voltage distributions of the memory cells of the second memory block BLK2. While read operations on the first to third logic pages of the second memory block BLK2 are sequentially performed by sequentially applying the first to seventh read voltages R1 to R7 according to the LSB default read voltage application order, the CSB default read voltage application order and the MSB default read voltage application order, threshold voltage distributions of the memory cells of the second memory block BLK2 may be changed to be more similar to the original threshold voltage distributions than the first threshold voltage distributions.

The threshold voltage distributions may shift each time the read voltages are sequentially applied, and the read voltages may have different degrees of influence by the shifts of the threshold voltage distributions in identifying cell distributions that represent different states. Read voltages having different degrees of influence by shifts of threshold voltage distributions are described below with reference to FIGS. 9A to 9C.

Figure 9A:
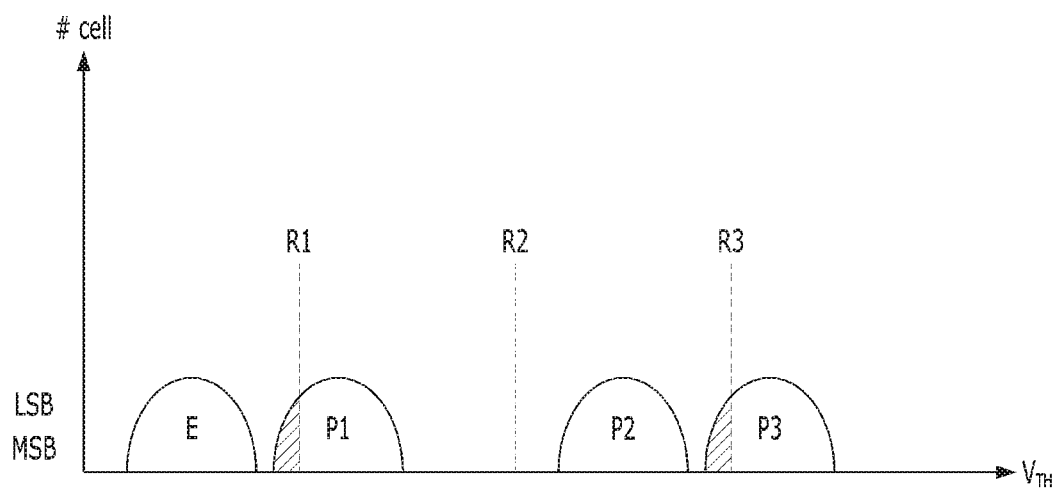
FIGS. 9A to 9C are diagrams to assist in the explanation of read voltages having different degrees of influence by shifts of threshold voltage distributions.
Figure 9B:
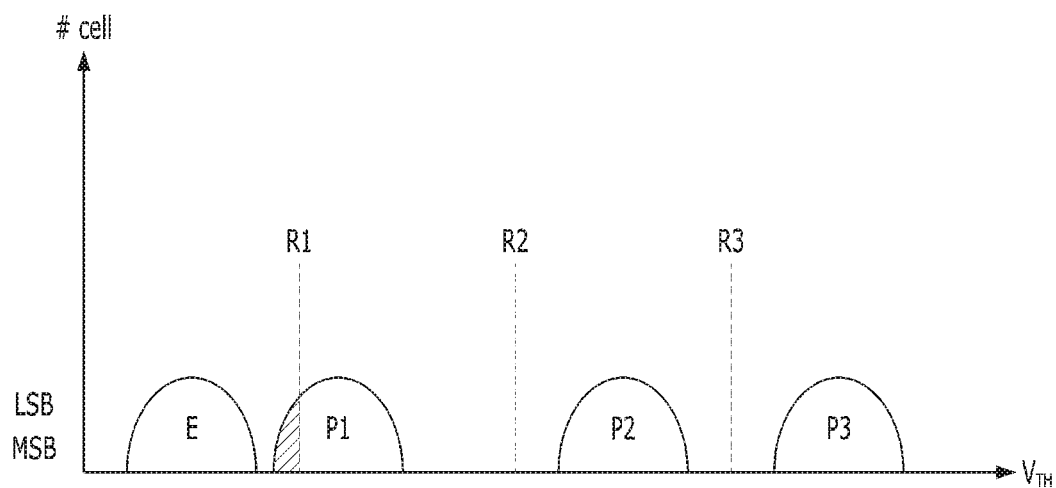
Figure 9C:
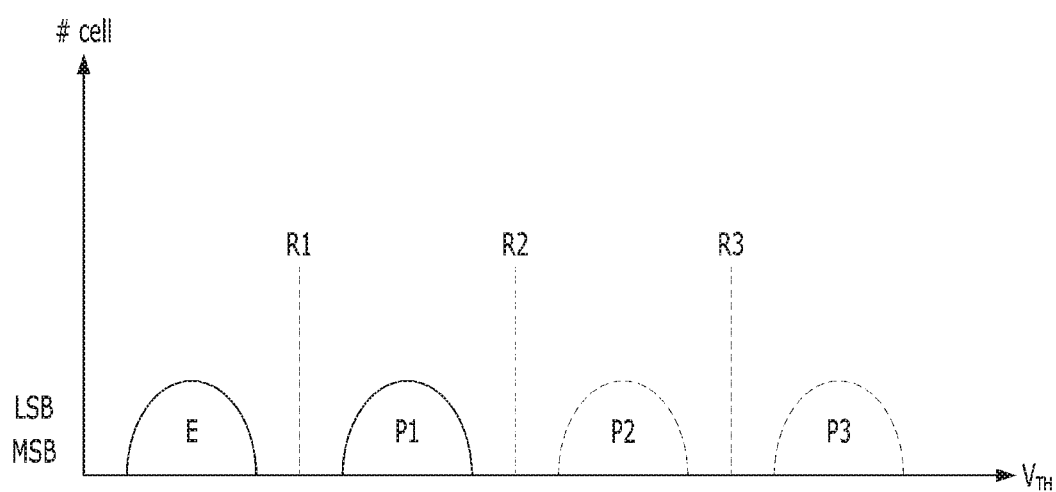

FIGS. 9A to 9C diagrams to assist in the explanation of read voltages having different degrees of influence by shifts of threshold voltage distributions in an MLC memory device.

FIG. 9A illustrates first threshold voltage distributions as threshold voltage distributions of the memory cells of the second memory block BLK2 as one memory block of the problem occurrence candidate group PC_CANDID immediately after the problem-causing operation is performed on the first memory block BLK1. By way of example, original threshold voltage distributions of the memory cells of the second memory block BLK2 are the same as described with reference to FIG. 5. In addition, first to third read voltages R1 to R3 in FIG. 9A are the same as first to third read voltages R1 to R3 illustrated in FIG. 5. Moreover, description is made for a case where, after a read operation on the first logic page is performed as the second read voltage R2 is first applied as the LSB read voltage, a read operation on the second logic page is performed as the first read voltage R1 and the third read voltage R3 are sequentially applied according to the MSB default read voltage application order.

Referring to FIG. 9A, it may be checked that threshold voltage distributions representing the erase state E and the first to third program states P1 to P3, respectively, have different degrees at which they shift due to the problem-causing operation. For example, it may be checked that threshold voltage distributions representing the erase state E and the second program state P2, respectively, have not changed much compared to the original threshold voltage distributions and threshold voltage distributions representing the first and third program states P1 and P3, respectively, have shifted in a direction in which a threshold voltage $V_{TH}$ decreases.

As described above with reference to FIG. 5, whether data stored in a memory cell represents the first program state P1 may be identified by performing a read operation on the first logic page through applying the second read voltage R2 as the LSB read voltage and performing a read operation on the second logic page through applying the first read voltage R1 as the MSB read voltage. In the memory cells having the first threshold voltage distributions illustrated in FIG. 9A, since all memory cells having threshold voltages included in the first program state P1 will be turned on when the second read voltage R2 is applied, LSB data read according to the read operation on the first logic page may not include an error. Referring to FIG. 9A, as the threshold voltage distributions shift after the problem-causing operation is performed, threshold voltages of some memory cells among the memory cells having the threshold voltages included in the first program state P1 are lower than the first read voltage R1. Therefore, when the first read voltage R1 is applied as the MSB read voltage, since the some memory cells among the memory cells having the threshold voltages included in the first program state P1 will be turned on to be misidentified as representing the erase state E, MSB data read according to the read operation on the second logic page may include an error.

Also, whether data stored in a memory cell represents the third program state P3 may be identified by performing a read operation on the first logic page through applying the second read voltage R2 as the LSB read voltage and performing a read operation on the second logic page through applying the third read voltage R3 as the MSB read voltage. In the memory cells having the first threshold voltage distributions illustrated in FIG. 9A, since all memory cells having threshold voltages included in the third program state P3 will be turned off when the second read voltage R2 is applied, LSB data read according to the read operation on the first logic page may not include an error. Referring to FIG. 9A, as the threshold voltage distributions shift after the problem-causing operation is performed, threshold voltages of some memory cells among the memory cells having the threshold voltages included in the third program state P3 are lower than the third read voltage R3. Therefore, when the third read voltage R3 is applied as the MSB read voltage, since the some memory cells among the memory cells having the threshold voltages included in the third program state P3 will be turned on to be misidentified as representing the second program state P2, MSB data read according to the read operation on the second logic page may include an error.

As the threshold voltage distributions shift, MSBs of the some memory cells having the threshold voltages included in the first program state P1 may be read as values different from intended values according to the first read voltage R1, and MSBs of the some memory cells having the threshold voltages included in the third program state P3 may also be read as values different from intended values according to the third read voltage R3. However, LSBs of all memory cells having threshold voltages included in the first and third program states P1 and P3 may be read without an error according to the second read voltage R2. Even after the threshold voltage distributions have shifted according to the problem-causing operation, the LSBs of the memory cells may be normally read without an error as the second read voltage R2 is applied. Therefore, the second read voltage R2 may be a read voltage which is least influenced by the shifts of the threshold voltage distributions due to the problem-causing operation.

FIG. 9B illustrates second threshold voltage distributions as threshold voltage distributions of the memory cells included in the second memory block BLK2 after the second read voltage R2 is applied to the second memory block BLK2.

FIG. 9B illustrates, for example, a case where, after the read operation on the first logic page of the second memory block BLK2 is performed by applying the second read voltage R2, the threshold voltage distribution representing the third program state P3 has shifted in a direction in which a threshold voltage $V_{TH}$ increases. Referring to FIG. 9B, it may be checked that the second threshold voltage distributions are more similar to the original threshold voltage distributions than the first threshold voltage distributions. When comparing the first and second threshold voltage distributions, threshold voltages of some memory cells of the memory cells having the threshold voltages included in the first program state P1 are still smaller in magnitude than the first read voltage R1. Therefore, when the first read voltage R1 is applied as the MSB read voltage, since the some memory cells among the memory cells having the threshold voltages included in the first program state P1 will be turned on to be misidentified as representing the erase state E, MSB data read according to the read operation on the second logic page may include an error.

On the other hand, it may be checked that, in the second threshold voltage distributions, threshold voltages of all the memory cells having the threshold voltages included in the third program state P3 are larger in magnitude than the third read voltage R3. Therefore, when the third read voltage R3 is applied as the MSB read voltage, since all the memory cells having the threshold voltages included in the third program state P3 will be turned off, MSB data may be normally read without an error according to the read operation on the second logic page. As the threshold voltage distributions shift after the read operation on the first logic page of the second memory block BLK2 is performed, MSB data values of memory cells having threshold voltages included in the second and third program states P2 and P3 may be normally identified by the third read voltage R3. On the other hand, when MSB data of memory cells having threshold voltages included in the erase state E and the first program state P1 are read by the first read voltage R1, MSB data values read may still include an error compared to the first threshold voltage distributions. Therefore, the third read voltage R3 may be a read voltage which is less influenced by the shifts of the threshold voltage distributions due to the problem-causing operation than the first read voltage R1.

FIG. 9C illustrates third threshold voltage distributions as threshold voltage distributions of the memory cells of the second memory block BLK2 after the first read voltage R1 is applied to the second memory block BLK2.

FIG. 9C illustrates, for example, a case where, after the read operation on the second logic page of the second memory block BLK2 is performed by applying the first read voltage R1, the threshold voltage distribution representing the first program state Pt has shifted in a direction in which a threshold voltage $V_{TH}$ increases.

Referring to FIG. 9C, it may be checked that the third threshold voltage distributions are most similar to the original threshold voltage distributions compared to the first and second threshold voltage distributions. The third threshold voltage distributions, like the original threshold voltage distributions, represent ideal distributions in which data stored in memory cells are read without an error by the first to third read voltages R1 to R3. Therefore, when the memory cells have the second threshold voltage distributions, the read operation on the second logic page of the second memory block BLK2 is performed by first applying the third read voltage R3 before the first read voltage R1, and then, when the memory cells have the third threshold voltage distributions, the read operation on the second logic page of the second memory block BLK2 is performed by applying the first read voltage R1, MSB data of all the memory cells may be read without an error.

While read voltages having different degrees of influence by shifts of threshold voltage distributions are described with reference to FIGS. 9A to 9C by taking the MLC memory device as an example, in the same manner even in the TLC memory device, the first to seventh read voltages R1 to R7 described above with reference to FIG. 6 may have different degrees of influence by shifts of threshold voltage distributions each time each of the problem-causing operation and read operations on the problem occurrence candidate group PC_CANDID is performed. Hereinafter, further features are described in the context of a TLC memory device as an example, but it is to be noted that the disclosure may be applied to other types of memory devices, e.g., the MLC memory device and the QLC memory device.

According to an embodiment of the disclosure, when a read command for any one memory block of the problem occurrence candidate group PC_CANDID is provided from the host 102, the controller 130 may determine an order of applying a plurality of read voltages, based on a table, the content of which may be preset. For example, as described later with reference to FIGS. 12 and 13, the table may include a read voltage application order corresponding to each of the plurality of memory blocks. For instance, the read voltage application order may be an order in which a read voltage least influenced by the shifts of the threshold voltage distributions caused by the problem-causing operation has a highest priority. The controller 130 may control the memory device 150 to perform a default read operation on the memory block, by applying a plurality of read voltages according to the read voltage application order.

According to an embodiment of the disclosure, the controller 130 may perform the default read operation by preferentially applying a read voltage which is not influenced by the problem-causing operation among the plurality of read voltages, based on the table. According to an embodiment of the disclosure, in consideration of the fact that changes in threshold voltage distributions are temporary and the threshold voltage distributions are recovered to original threshold voltage distributions as a read voltage is applied, the controller 130 may increase probability of read success by changing an order in which read voltages are applied, while performing the default read operation by applying the read voltages having read levels with the same magnitudes as compared to the conventional art.

Figure 10:
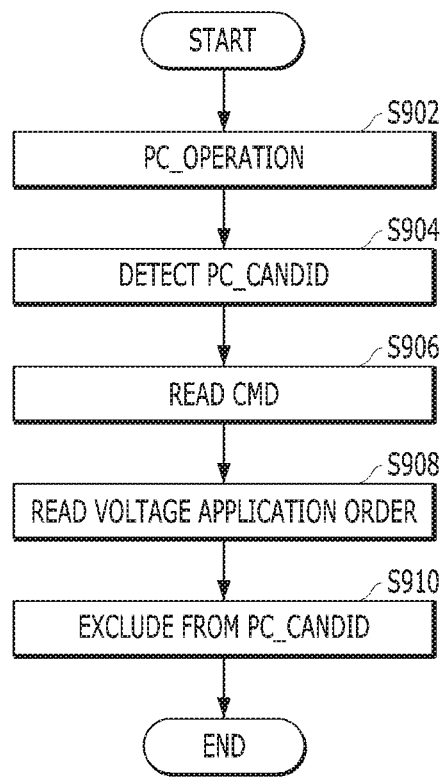
FIG. 10 is a flow chart illustrating an operation process of a memory system in accordance with an embodiment of the disclosure.

FIG. 10 is a flow chart illustrating an operation process of the memory system 110 in accordance with an embodiment of the disclosure.

At step S902, the controller 130 may control the memory device 150 to perform a problem-causing operation PC_OPERATION. The problem-causing operation PC_OPERATION may include an erase operation or a program operation. For instance, the controller 130 may control the memory device 150 to perform the problem-causing operation PC_OPERATION on the first memory block BLK1 in the zeroth plane 612 shown in FIG. 8.

At step S904, the controller 130 may detect a problem occurrence candidate group PC_CANDID. The problem occurrence candidate group PC_CANDID means the remaining memory blocks included in the same plane as a memory block on which the problem-causing operation PC_OPERATION was performed at the step S902. For example, the controller 130 may detect the second to twelfth memory blocks BLK2 to BLK12, in the zeroth plane 612 shown in FIG. 8, as the problem occurrence candidate group PC_CANDID. As described below with reference to FIG. 11, the controller 130 may write information indicating whether each of the memory blocks is in the problem occurrence candidate group PC_CANDID in a flag bit for each of the memory blocks. For example, the controller 130 may indicate information that the second to twelfth memory blocks BLK2 to BLK12 are detected as the problem occurrence candidate group PC_CANDID and thus a flag bit corresponding to each of the second to twelfth memory blocks BLK2 to BLK12 is set to a logic high level.

At step S906, the controller 130 may receive a read command READ CMD from the host 102. A physical address mapped to a logical address included in the read command READ CMD may indicate any one memory block of the problem occurrence candidate group PC_CANDID detected at step S904. For example, the physical address mapped to the logical address included in the read command READ CMD may indicate the second memory block BLK2 among the second to twelfth memory blocks BLK2 to BLK12.

At step S908, the controller 130 may determine an application order of read voltages to be used in a read operation for the read command READ CMD received at step S906, based on a table, the content of which may be preset. According to an embodiment of the disclosure, as described above with reference to FIGS. 9A to 9C, threshold voltage distributions for the problem occurrence candidate group PC_CANDID may temporarily shift due to the problem-causing operation PC_OPERATION performed at step S902, and the table may include information on a read voltage application order generated in consideration of degrees to which the read voltages are influenced by the shifted threshold voltage distributions.

For example, the table may be generated through a test performed when the memory system 110 is manufactured. The test may include operations of performing the problem-causing operation PC_OPERATION on a select memory block, e.g., BLK1, among memory blocks in the same plane, and then performing a plurality of read operations on a different memory block, e.g., BLK2, among the remaining memory blocks BLK2 to BLK12 in the plane, while changing a read voltage application order. A read voltage application order corresponding to a read operation resulting in the least number of error bits, among the plurality of read operations, may be matched to the second memory block BLK2. Detailed description of the table is given below with reference to FIGS. 12 and 13.

According to an embodiment of the disclosure, the controller 130 may determine the read voltage application order based on the table and may control the memory device 150 to perform a default read operation, by sequentially applying read voltages according to the determined order, thereby increasing the possibility of success of the default read operation and preventing or minimizing read performance degradation.

At step S910, the controller 130 may release the memory block on which the default read operation was performed according to the changed read voltage application order from the problem occurrence candidate group PC_CANDID. For example, the controller 130 may exclude the second memory block BLK2 from the problem occurrence candidate group PC_CANDID, after performing the default read operation according to the read voltage application order determined based on the table for the second memory block BLK2. As described below with reference to FIG. 14, the controller 130 may exclude the second memory block BLK2 from the problem occurrence candidate group PC_CANDID, by setting the flag bit for the second memory block BLK2 to a logic low level.

FIG. 11 is a diagram to assist in the explanation of a method for indicating whether a memory block is detected as being in a problem occurrence candidate group, by using a flag bit for the memory block.

By way of example, FIG. 11 illustrates flag bits for the first to twelfth memory blocks BLK1 to BLK12, respectively, in the zeroth plane PLANE 0.

After controlling the memory device 150 to perform the problem-causing operation on the first memory block BLK1 in the zeroth plane PLANE 0, the controller 130 may detect that the remaining memory blocks, i.e., BLK2 to BLK12, which represent all other memory blocks in PLANE 0 except the first memory block BLK1, as the problem occurrence candidate group PC_CANDID. The controller 130 may set a value of a flag bit for each of the second to twelfth memory blocks BLK2 to BLK12 detected as being in the problem occurrence candidate group PC_CANDID to a logic high level. For example, as illustrated in FIG. 11, the controller 130 may set the flag bit for each of the second to twelfth memory blocks BLK2 to BLK12 to a value of '1.'

Thereafter, when a read command for the second memory block BLK2 is provided from the host 102, the controller 130 may check the flag bit for the second memory block BLK2. When the flag bit for the second memory block BLK2 has a value of '1,' the controller 130 may determine that the second memory block BLK2 is in the problem occurrence candidate group PC_CANDID, and thus, as described above at the step S908 of FIG. 10, may change a read voltage application order to be applied BLK2 based on the table.

FIGS. 12 and 13 are diagrams to assist in the explanation of a table including read voltage application orders.

FIG. 12 is a diagram to assist in the explanation of read voltage application orders that may be generated by combining a plurality of read voltages.

In the TLC memory device, the erase state E and the first to seventh program states P1 to P7 may be identified using the seven read voltages R1 to R7. In detail, as described above with reference to FIG. 6, values of LSBs of data stored in memory cells may be identified using the third and seventh read voltages R3 and R7, values of CSBs of the data may be identified using the second, fourth and sixth read voltages R2, R4 and R6, and values of MSBs of the data may be identified using the first and fifth read voltages R1 and R5. According to an embodiment, a read operation on a first logic page performed using R3 and R7 as LSB read voltages, a read operation on a second logic page performed using R2, R4 and R6 as CSB read voltages, and a read operation on a third logic page performed using R1 and R5 as MSB read voltages may be performed independently of one another. In an embodiment, a read operation on one physical page includes a first read operation on a first logic page, a second read operation on a second logic page and a third read operation on a third logic page, and the first to third read operations are performed in that order. However, the present invention is not limited to performing the first to third read operations in any particular order.

With respect to the first read operation, there are two (2) possible LSB read voltage application orders that may be generated from the third and seventh read voltages R3 and R7. Referring to FIG. 12, the two cases are identified as CASE 1-1 and CASE 1-2, respectively. In CASE1-1 read voltages are applied in the order of the third read voltage R3 and the seventh read voltage R7 to perform the first read operation, and in CASE1-2 read voltages are applied in the order of the seventh read voltage R7 and the third read voltage R3 to perform the first read operation.

With respect to the second read operation, there are six (6) possible CSB read voltage application orders that may be generated from the second, fourth and sixth read voltages R2, R4 and R6. These six (6) orders are identified in FIG. 12 as CASE2-1 to CASE2-6. In CASE2-1 read voltages are applied in the order of the second, fourth and sixth read voltages R2, R4 and R6 to perform the second read operation, and in CASE2-2 read voltages are applied in the order of the second, sixth and fourth read voltages R2, R6 and R4 to perform the second read operation. The orders of the other four cases (CASE2-3 to CASE2-6) are shown in FIG. 12.

With respect to the third read operation, there are two (2) possible MSB read voltage application orders (CASE3-1 and CASE3-2) that may be generated from the first and fifth read voltages R1 and R5. In CASE3-1 read voltages are applied in the order of the first read voltage R1 and the fifth read voltage R5 to perform the third read operation, and in CASE3-2 read voltages are applied in the order of the fifth read voltage R5 and the first read voltage R1 to perform the third read operation.

FIG. 13 is a diagram illustrating a table including read voltage application orders.

Referring to FIG. 13, a table 1202 may represent information on an LSB read voltage application order, a CSB read voltage application order and an MSB read voltage application order for each of the first to twelfth memory blocks BLK1 to BLK12 in the zeroth plane PLANE 0. The read voltage application orders of the table 1202 may be preset. Hereunder, the table 1202 illustrated in FIG. 13 is described, as an example, by considering an LSB read voltage application order, a CSB read voltage application order and an MSB read voltage application order for the first memory block BLK1 among the first to twelfth memory blocks BLK1 to BLK12.

For example, the LSB read voltage application order for the first memory block BLK1 may correspond to CASE1-2. In detail, the LSB read voltage application order for the first memory block BLK1 may be the order of the seventh read voltage R7 and the third read voltage R3. The CSB read voltage application order for the first memory block BLK1 may correspond to CASE2-2. In detail, the CSB read voltage application order for the first memory block BLK1 may be the order of the second read voltage R2, the sixth read voltage R6 and the fourth read voltage R4. The MSB read voltage application order for the first memory block BLK1 may correspond to CASES-1. In detail, the MSB read voltage application order for the first memory block BLK1 may be the order of the first read voltage R1 and the fifth read voltage R5.

In the same manner as the above-described case of the first memory block BLK1, the table 1202 may include information on an LSB read voltage application order, a CSB read voltage application order and an MSB read voltage application order corresponding to each of the second to twelfth memory blocks BLK2 to BLK12. The table 1202 may be generated through a test during manufacture of the memory system 110. Hereinafter, a method of determining a read voltage application order for the second memory block BLK2 is described as an example.

After the problem-causing operation is performed on the first memory block BLK1, a first default read operation may be performed on a memory block of the problem occurrence candidate group PC_CANDID, which in this example is memory block BLK2. The first default read operation may include a first LSB read operation, a first CSB read operation and a first MSB read operation. According to an embodiment, in a test operation, the first LSB read operation, the first CSB read operation and the first MSB read operation may be performed independently of one another. For example, first LSB read operations are performed a plurality of, e.g., 2 times with a different LSB read voltage application order each time. One order corresponds to CASE1-1 and the other order corresponds to CASE1-2. In each read operation, the number of LSB error bits that occur is measured. First CSB read operations are performed a plurality of, e.g., 6 times, with a different CSB read voltage application order each time. The orders correspond to CASE2-1 to CASE2-6, respectively. In each read operation, the number of CSB error bits that occur is measured. Also, first MSB read operations are performed a plurality of, e.g., 2 times, with a different MSB read voltage application order each time. The orders correspond to CASES-1 and CASES-2, respectively. In each read operation, the number of MSB error bits that occur is measured.

Among the first LSB read operations the order that results in the lowest number of LSB error bits is determined as the LSB read voltage application order for the second memory block BLK2, among the first CSB read operations the order that results in the lowest number of LSB error bits is determined as the CSB read voltage application order for the second memory block BLK2, and among the first MSB read operations the order that results in the lowest number of MSB error bit is determined as the MSB read voltage application order for the second memory block BLK2. By recording the determined LSB read voltage application order, CSB read voltage application order and MSB read voltage application order for the second memory block BLK2 in a table, the table may be generated.

LSB, CSB and MSB read voltage application orders may be determined for each of the other memory blocks in the problem occurrence candidate group in the same manner as described above for memory block BLK2, and those orders may be included in the table 1202 as well.

Although FIG. 13 illustrates a table in which a read voltage application order is differently applied depending on a memory block, according to another embodiment of the disclosure, the table may differently apply a read voltage application order depending on a word line or a page.

FIG. 14 is a diagram illustrating flag bits for memory blocks, respectively, for releasing a memory block from the problem occurrence candidate group.

FIG. 14 illustrates flag bits for the memory blocks BLK1 to BLK12 in the zeroth plane PLANE 0 after the second memory block BLK2 is excluded from the problem occurrence candidate group PC_CANDID. The controller 130 may exclude the second memory block BLK2 from the problem occurrence candidate group PC_CANDID after performing the default read operation according to the read voltage application order determined based on the table 1202 for the second memory block BLK2. The controller 130 may set a value of the flag bit for the second memory block BLK2 to a logic low level to indicate that the second memory block BLK2 is excluded from the problem occurrence candidate group PC_CANDID. For example, the controller 130 may set the flag bit for the second memory block BLK2 to a value of '0,' among the flag bits described above with reference to FIG. 11.

According to an embodiment of the disclosure, the controller 130 may exclude the second memory block BLK2 from the problem occurrence candidate group PC_CANDID after performing the default read operation on the second memory block BLK2 detected as being in the problem occurrence candidate group PC_CANDID according to a read voltage application order changed based on the table 1202. As described above, a phenomenon in which the number of read errors sharply increases in the default read operation performed on the problem occurrence candidate group PC_CANDID, due to the problem-causing operation, may be temporary. For example, after a certain memory block is detected as the problem occurrence candidate group PC_CANDID, the number of read errors may sharply increase only in a first default read operation first performed on that memory block, and the number of read errors may decrease in a second default read operation performed on the memory block after the first default read operation is performed. The first and second default read operations mean a case where memory cells are read by applying read voltages having default read levels, respectively, described above with reference to step S602 of FIG. 7, according to a default read voltage application order.

In the second default read operation, since there is no increase in the number of read errors, even when a read voltage application order changed based on the table 1202 is not applied, the controller 130 may exclude the second memory block BLK2 from the problem occurrence candidate group PC_CANDID after the first default read operation is performed. Therefore, the controller 130 may control the memory device 150 to apply a read voltage application order determined based on the table 1202 only in the first default read operation on the second memory block BLK2 and then to perform a read operation according to the default read voltage application order in the second default read operation.

Although various embodiments have been illustrated and described, it will be apparent to those skilled in the art that various changes and modifications may be made without departing from the spirit and scope of the invention as defined in the following claims. The present invention encompasses all variations and modifications that fall within the scope of the claims.

What is claimed is:

1. A memory system comprising:
a memory device including a plane including a plurality of memory blocks for storing multi-bit data; and
a controller configured to:
detect, when a problem-causing operation is performed on a first memory block among the memory blocks, remaining memory blocks, except the first memory block, in the plane as being in a problem occurrence candidate group,
search a table, when a read command for a second memory block of the problem occurrence candidate group is received, for a read voltage application order corresponding to the second memory block, and
control the memory device to perform a read operation on the second memory block by sequentially applying a plurality of read voltages according to the searched read voltage application order,
wherein the problem-causing operation is a program operation or an erase operation,
wherein the controller controls, in response to the read command immediately after the problem-causing operation, the memory device to perform a first read operation on the second memory block based on a secondary set of the plurality of read voltages; and controls, in response to the read command immediately after a successful read operation set including the first read operation on the second memory block, the memory device to perform a second read operation on the second memory block based on a primary set of the plurality of read voltages.

2. The memory system according to claim 1, wherein the table includes read voltage application orders corresponding to the plurality of memory blocks, respectively.

3. The memory system according to claim 1, wherein the controller is further configured to exclude the second memory block from the problem occurrence candidate group after performing the read operation.

4. The memory system according to claim 1, wherein the controller is further configured to set a flag bit for each memory block within the problem occurrence candidate group to a logic high level.

5. The memory system according to claim 3, wherein the controller excludes the second memory block from the problem occurrence candidate group by setting a flag bit for the second memory block to a logic low level.

6. The memory system according to claim 1, wherein the controller is further configured to control the memory device to perform a read retry operation when the read operation fails.

7. The memory system according to claim 1, wherein the table includes a plurality of read voltage application orders.

8. The memory system according to claim 7, wherein the read operation on the second memory block based on the read voltage application order determined by shifts of threshold voltage distributions due to the problem-causing operation.

9. The memory system according to claim 5, wherein the controller is further configured to control the memory device to perform a read operation according to a default read voltage application order, when a flag bit for a memory block corresponding to a subsequent read command is a logic low level.

10. The memory system according to claim 1, wherein the controller is further configured to output error-corrected data when the read operation succeeds.

11. A method for operating a memory system, comprising:
performing a problem-causing operation on a first memory block among memory blocks included in a plane, in which multi-bit data is stored in each cell;
detecting remaining memory blocks, except the first memory block, in the plane, as being in a problem occurrence candidate group;
receiving a read command for a second memory block of the problem occurrence candidate group;
searching for a read voltage application order corresponding to the second memory block from a table; and
performing a read operation on the second memory block by sequentially applying a plurality of read voltages according to the searched read voltage application order, wherein the problem-causing operation is a program operation or an erase operation, wherein the performing of the read operation includes:
performing, in response to the read command immediately after the problem-causing operation, a first read operation on the second memory block based on a secondary set of the plurality of read voltages; and
performing, in response to the read command immediately after a successful read operation set including the first read operation on the second memory block, a second read operation on the second memory block based on a primary set of the plurality of read voltages.

12. The method according to claim 11, wherein the table includes read voltage application orders corresponding to the memory blocks, respectively.

13. The method according to claim 11, further comprising: excluding the second memory block from the problem occurrence candidate group after the read operation is performed.

14. The method according to claim 11, further comprising setting a flag bit for each memory block within the problem occurrence candidate group to a logic high level.

15. The method according to claim 13, wherein the excluding includes setting a flag bit for the second memory block to a logic low level.

16. The method according to claim 11, further comprising: performing a read retry operation when the read operation fails.

17. The method according to claim 11, wherein the table includes a plurality of read voltage application orders.

18. The method according to claim 17, wherein the read operation on the second memory block based on the searched read voltage application order determined by shifts of threshold voltage distributions due to the problem-causing operation.

19. The method according to claim 15, further comprising: performing a read operation according to a default read voltage application order, when a flag bit for a memory block corresponding to a subsequent read command is a logic low level.

20. An operating method of a controller, the operating method comprising:
controlling a memory device to perform a program operation or an erase operation on a first block;
controlling, in response to a command immediately after the program or erase operation, the memory device to perform a first default read operation on a second block based on a secondary set of read voltages, the second block neighboring the first block; and
controlling, in response to a command immediately after a successful read operation set including the first default read operation on the second block, the memory device to perform a second default read operation on the second block based on a primary set of read voltages,
wherein the primary and secondary sets have different application orders of the read voltages.

* * * * *